US009442506B2

(12) United States Patent
Huang et al.

(10) Patent No.: US 9,442,506 B2
(45) Date of Patent: Sep. 13, 2016

(54) VOLTAGE REFERENCE CIRCUIT WITH TEMPERATURE COMPENSATION

(71) Applicant: TAIWAN SEMICONDUCTOR MANUFACTURING COMPANY, LTD., Hsinchu (TW)

(72) Inventors: Ming-Chieh Huang, San Jose, CA (US); Tien-Chun Yang, San Jose, CA (US); Steven Swei, Fremont, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 58 days.

(21) Appl. No.: 14/051,631

(22) Filed: Oct. 11, 2013

(65) Prior Publication Data

US 2014/0035553 A1 Feb. 6, 2014

Related U.S. Application Data

(62) Division of application No. 12/825,652, filed on Jun. 29, 2010, now Pat. No. 8,575,998.

(60) Provisional application No. 61/222,852, filed on Jul. 2, 2009.

(51) Int. Cl.

| | |
|---|---|
| ***G05F 3/30*** | (2006.01) |
| ***H03K 3/2893*** | (2006.01) |
| ***G05F 3/02*** | (2006.01) |
| ***G05F 3/24*** | (2006.01) |

(52) U.S. Cl.
CPC .................. *G05F 3/02* (2013.01); *G05F 3/245* (2013.01)

(58) Field of Classification Search
CPC .......... G06F 3/30; G06F 3/245; G06F 3/242; G06F 3/262
USPC ............. 323/907, 312–317; 327/138, 82–83, 327/512–513
See application file for complete search history.

(56) References Cited

U.S. PATENT DOCUMENTS

| | | | | | |
|---|---|---|---|---|---|
| 5,243,231 | A * | 9/1993 | Baik | G05F 3/262 327/535 |
| 6,169,456 | B1 * | 1/2001 | Pauls | 330/288 |
| 6,201,381 | B1 | 3/2001 | Yasuda | |
| 6,737,909 | B2 * | 5/2004 | Jaussi | G01R 35/007 327/541 |
| 6,919,753 | B2 * | 7/2005 | Wang | G05F 3/245 327/513 |
| 6,946,896 | B2 * | 9/2005 | Behzad | G05F 3/262 327/512 |
| 7,119,527 | B2 * | 10/2006 | Fernald | G05F 3/262 323/313 |
| 7,157,894 | B2 * | 1/2007 | Fulton | G05F 3/262 323/315 |
| 2006/0164151 | A1 * | 7/2006 | Chatterjee et al. | 327/512 |
| 2006/0279269 | A1 | 12/2006 | Yang | |
| 2008/0238530 | A1 * | 10/2008 | Ito et al. | 327/513 |
| 2010/0072972 | A1 * | 3/2010 | Yoshikawa | 323/313 |
| 2011/0074496 | A1 * | 3/2011 | Yoshino et al. | 327/539 |

* cited by examiner

*Primary Examiner* — Timothy J Dole
*Assistant Examiner* — Sisay G Tiku
(74) *Attorney, Agent, or Firm* — Hauptman Ham, LLP

(57) ABSTRACT

A voltage reference circuit with temperature compensation includes a power supply, a first reference voltage supply, a first PMOS transistor, a second PMOS transistor, a first NMOS transistor, a second NMOS transistor, a resistor connected to the second NMOS source and ground. The voltage reference circuit also includes a second reference voltage supply, a third PMOS transistor, a fourth PMOS transistor, a third NMOS transistor, a fourth NMOS transistor, and a fifth NMOS transistor with a drain connected to the source of the fourth NMOS transistor, a source connected to the ground, and a gate connected to the first reference voltage output.

19 Claims, 6 Drawing Sheets

VOLTAGE REFERENCE CIRCUIT WITH TEMPERATURE COMPENSATION

CROSS-REFERENCE TO RELATED APPLICATIONS

The present application is a divisional of U.S. application Ser. No. 12/825,652, now U.S. Pat. No. 8,575,998, filed Jun. 29, 2010, which claims priority of U.S. Provisional Application No. 61/222,852, filed Jul. 2, 2009, which are incorporated herein by reference in their entireties.

TECHNICAL FIELD

This invention relates generally to a voltage reference circuit, more specifically a voltage reference circuit with temperature compensation for constant transconductance (Gm) design.

BACKGROUND

A voltage reference circuit is an electronic device (circuit or component) that produces a fixed (constant) voltage irrespective of the loading on the device, process, power supply variation and temperature. A voltage reference circuit is one of important analog blocks in integrated circuits.

One common voltage reference circuit used in integrated circuits is the bandgap voltage reference circuit. A bandgap-based reference circuit uses analog circuits to add a multiple of the voltage difference between two bipolar junctions biased at different current densities to the voltage developed across a diode. The diode voltage has a negative temperature coefficient (i.e. it decreases with increasing temperature), and the junction voltage difference has a positive temperature coefficient. When added in the proportion required to make these coefficients cancel out, the resultant constant value is a voltage equal to the bandgap voltage of the semiconductor. However, the bandgap design requires relatively large area and power.

Another voltage reference circuit design is a constant transconductance (Gm) design.

FIG. 1A is a schematic diagram of a conventional constant Gm voltage reference circuit without temperature compensation. Two PMOS transistors 102 and 104 that are connected to VDD share the gate connections. NMOS transistors 106 and 108 are connected to PMOS transistors 102 and 104 and share the gate connections to the output voltage VREF, while the gate and drain of PMOS 104 are connected together and the gate and drain of NMOS 106 are connected together. The NMOS channel size ratio of 106 and 108 are W/L:K(W/L)=1:K, where W/L is the width over length of the channel of the NMOS transistors. The source of NMOS 106 is connected to ground (VSS) and the source of NMOS 108 is connected to ground (VSS) through resistor Rs 110. Constant Gm design requires relatively small area and power, but suffers from a strong temperature dependence.

With $V_{TH}$ as the threshold voltage of NMOS 108, the current and voltage of the voltage reference circuit shown in FIG. 1A are given by the following equations:

$$Iref = \frac{2}{\mu_N C_{OX}\left(\frac{W}{L}\right)_N * Rs^2}\left(1 - \frac{1}{\sqrt{K}}\right)^2 \quad \text{(Eq. 1)}$$

-continued $$VREF = V_{TH} + \sqrt{\frac{2I_{ref}}{\mu_N C_{ox} K\left(\frac{W}{L}\right)_N}} + I_{ref} R_S, \quad \text{(Eq. 2)}$$

where $\mu_N$ is the mobility of the NMOS, $C_{ox}$ is the gate oxide capacitance, W/L is the width over length of the channel of the NMOS.

With increasing temperature, the mobility $\mu_N$ decreases, therefore results in higher Iref in Eq. 1. On the other hand, with increasing temperature, the threshold voltage $V_{TH}$ decreases, resulting in lower VREF in Eq. 2. Therefore VREF shows strong dependency on temperature. For example, compared to an exemplary bandgap design voltage reference circuit with a layout area of 77×53 $\mu m^2$ and 180 $\mu A$ current requirement that showed about 3 mV variation over −40° C.-125° C., an exemplary constant Gm design voltage reference circuit with a layout area of 24×7.3 $\mu m^2$ and 10 $\mu A$ current requirement showed a temperature variation of 18 mV over the same temperature range, as shown in FIG. 1B (a temperature vs. voltage output plot for an exemplary voltage reference circuit shown in FIG. 1A).

Accordingly, new temperature compensation schemes are desired for voltage reference with constant Gm design.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A voltage reference circuit with temperature compensation for constant Gm design is provided. Throughout the various views and illustrative embodiments of the present invention, like reference numbers are used to designate like elements.

Figure 2A:
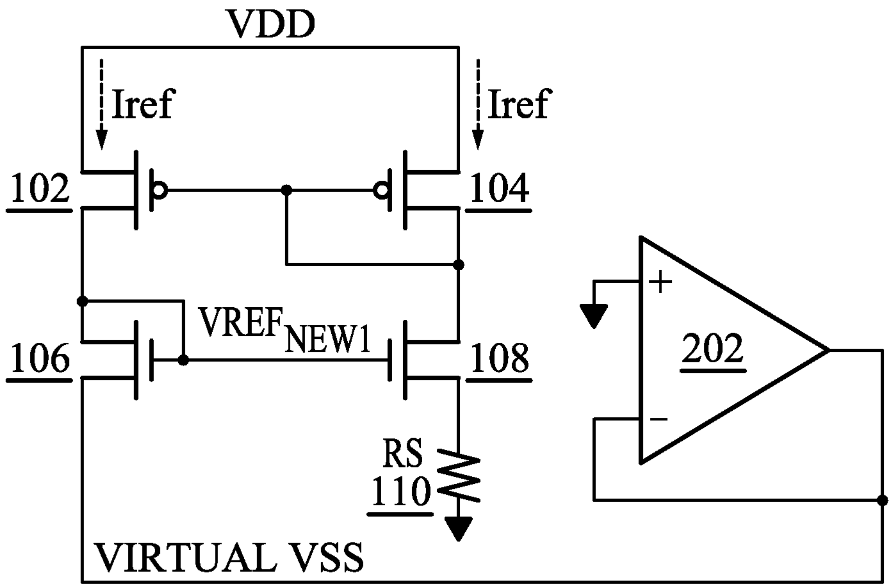
FIG. 2A is a schematic diagram of an exemplary voltage reference circuit with temperature compensation for constant Gm design according to one aspect of the invention.

FIG. 2A is a schematic diagram of an exemplary voltage reference circuit with temperature compensation for constant Gm design according to one aspect of the invention. An op amp 202 output coupled to the inverting input is connected to the source of the NMOS 106 (VirtualVSS). The non-inverting input of the op amp 202 is connected to the ground (VSS). Ideally, an op amp has infinite open loop gain, and zero output resistance. However, real op amps have limited gain and non-zero output resistance. The op amp 202 has a limited gain that can be adjustable.

With $V_{TH}$ as the threshold voltage of NMOS 108, the relationship between $VREF_{NEW1}$ and VirtualVSS can be expressed as the following:

$$VREF_{NEW1} - VirtualVSS = \sqrt{\frac{2I_{out}}{\mu_N C_{ox} K\left(\frac{W}{L}\right)_N}} + I_{ref} R_S + V_{TH}, \quad \text{(Eq. 3)}$$

where $$I_{ref} R_S = \sqrt{\frac{2I_{ref}}{\mu_N C_{ox}\left(\frac{W}{L}\right)_N}}\left(1 - \frac{1}{\sqrt{K}}\right)$$

Therefore, (Eq. 4)

$$VREF_{NEW1} = (VirtualVSS) + \left(V_{TH} + \sqrt{\frac{2I_{ref}}{\mu_N C_{ox}\left(\frac{W}{L}\right)_N}}\right)$$

In Eq. 4, the first term VirtualVSS increases with temperature increase because the limited gain op amp 202 cannot keep the VirtualVSS level to the ground as Iref in Eq. 1 increases. The second term in Eq. 4 decreases with temperature increase because of the threshold voltage $V_{TH}$ drop. As a result, $VREF_{NEW1}$ has small temperature variation since the first term in Eq. 4 (VirtualVSS) increases with temperature and the second term decreases with temperature. The gain of op amp 202 can be adjusted to find desired performance for temperature compensation.

In one integrated circuit embodiment, the current Iref was set to 5 µA, the NMOS transistor size ratio was 1:K=1:4 (K is a number greater than 1), and the resistance Rs was 8 kΩ. In other embodiments, the current Iref can range over 2-10 µA, K=4-16, Rs=1-40 kΩ. However, the circuit can be designed with different values without departing from the spirit and scope of the invention.

Figure 1A:
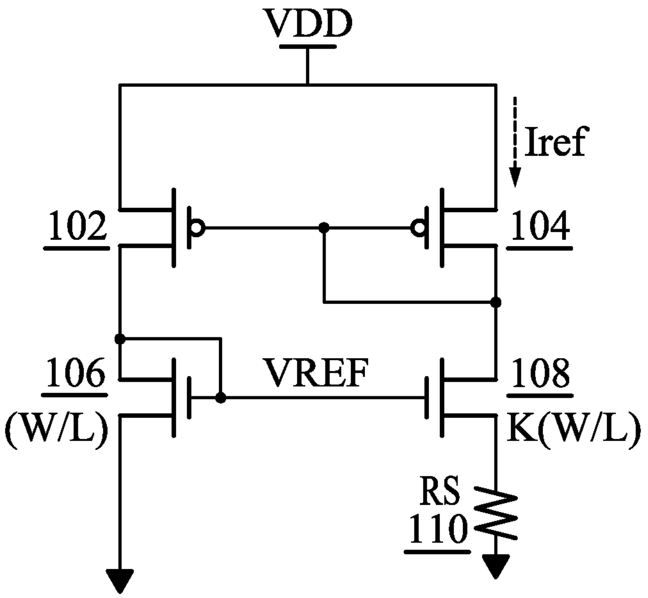
FIG. 1A ( PRIOR ART )
FIG. 1A is a schematic diagram of a conventional constant Gm voltage reference circuit without temperature compensation.
Figure 1B:
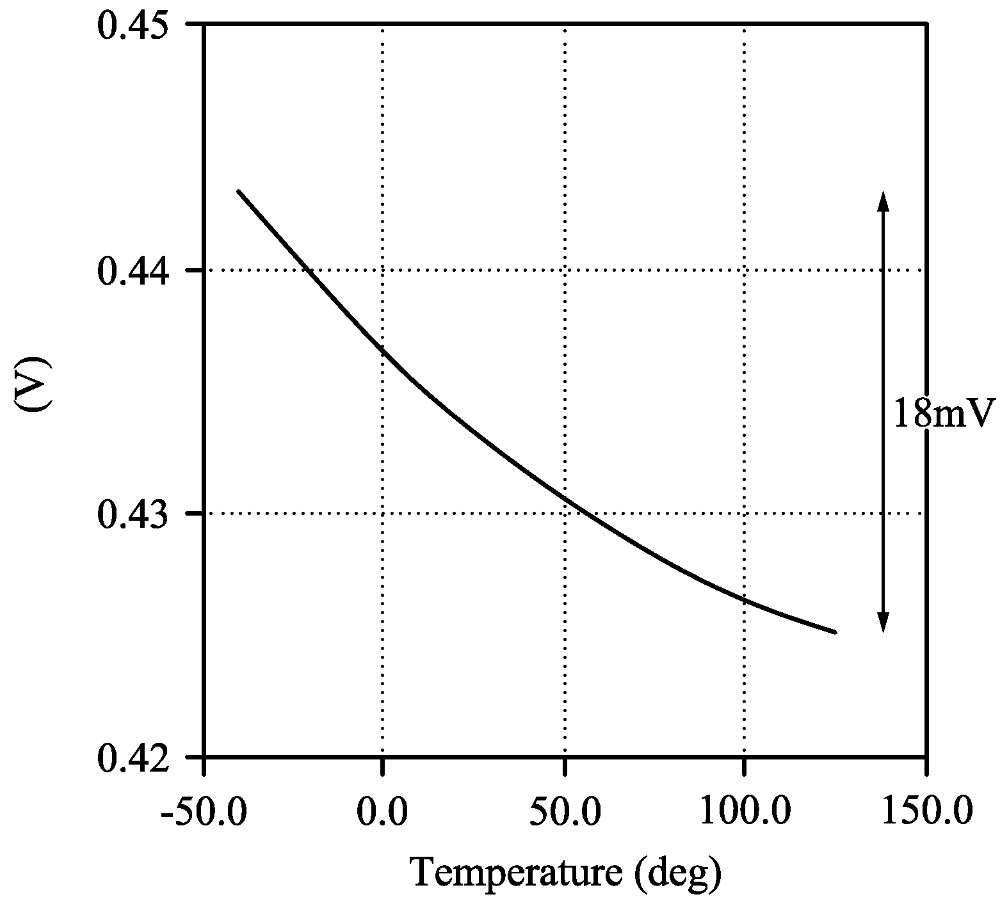
FIG. 1B is a temperature vs. voltage output plot for an exemplary voltage reference circuit shown in FIG. 1A.
Figure 2B:
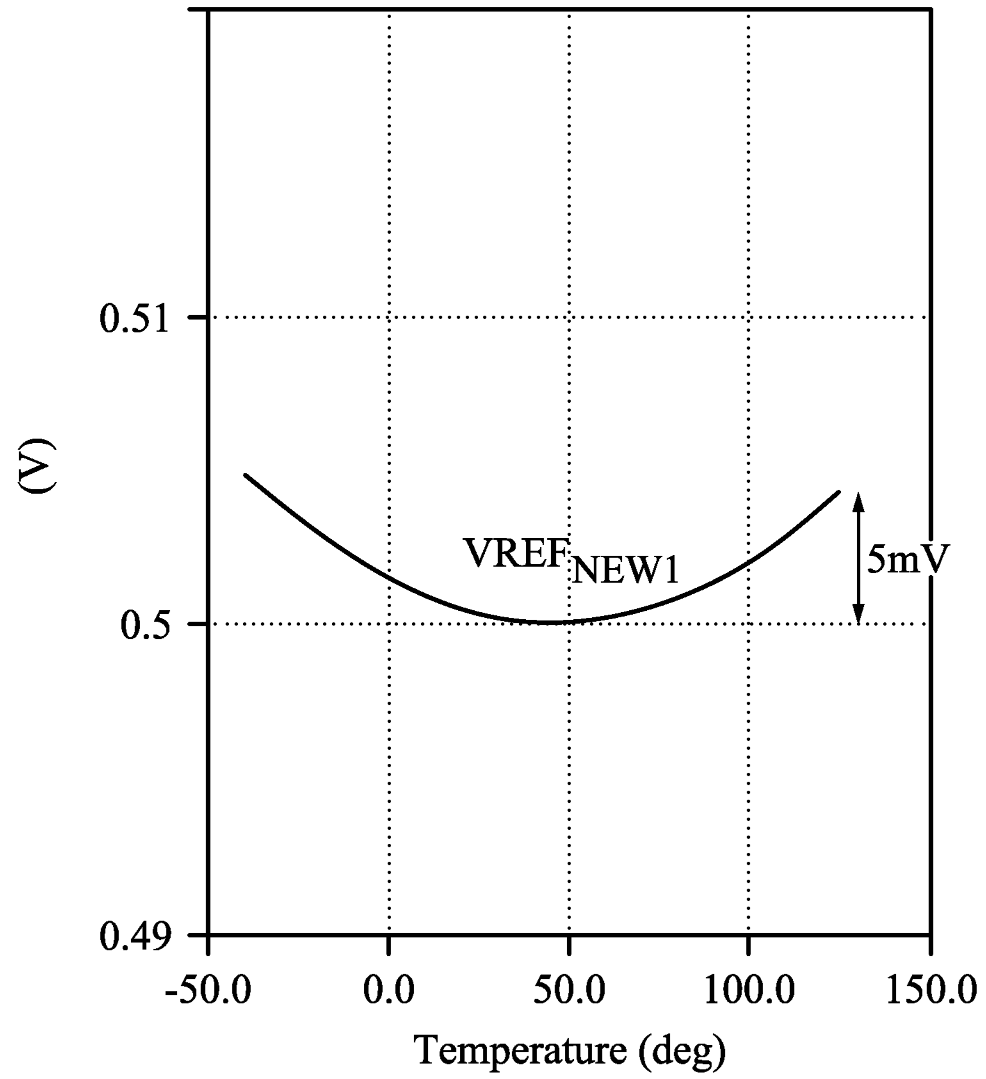
FIG. 2B is a temperature vs. voltage output plot for an embodiment of the voltage reference circuit shown in FIG. 2A.

FIG. 2B is a temperature vs. voltage output plot for an embodiment of the voltage reference circuit shown in FIG. 2A. It shows 5 mV variation over the temperature range of −40° C.-125° C., a big improvement compared to the voltage reference circuit without temperature compensation in FIG. 1A that showed 18 mV variation as shown in FIG. 1B.

Figure 3A:
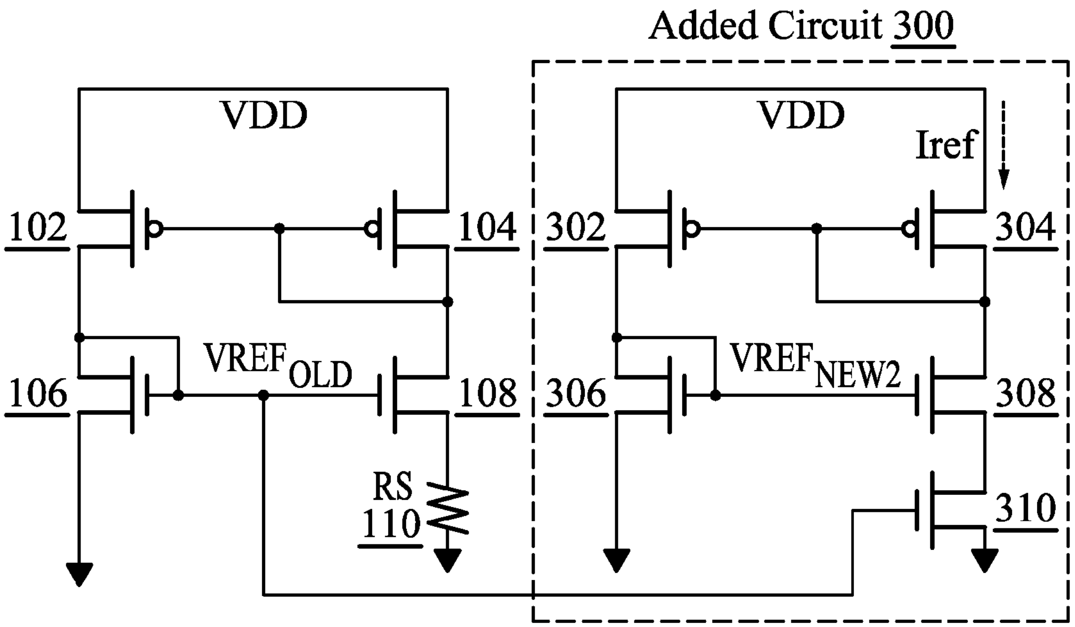
FIG. 3A is a schematic diagram of an exemplary voltage reference circuit with temperature compensation for constant Gm design according to another aspect of the invention.

FIG. 3A is a schematic diagram of an exemplary voltage reference circuit with temperature compensation for constant Gm design according to another aspect of the invention. In this scheme, the VREF from a constant Gm voltage reference on the left is connected to the gate of an NMOS 310 of the added circuit 300 on the right side. The added circuit 300 is similar to the constant Gm voltage reference circuit shown on the left side, but has the NMOS 310 in place of Rs 110 in the constant Gm voltage reference circuit. By connecting the VREF on the left side circuit to the gate of NMOS 310 on the right side, the VREF decrease with temperature increase can be compensated by the increasing source-gate resistance of the NMOS 310.

With $R_{TX}$ as the source-gate resistance of NMOS 310, the output voltage is given by the following:

$$VREF_{NEW2} = V_{TH2} + \sqrt{\frac{2I_{out}}{\mu_N C_{ox} K\left(\frac{W}{L}\right)_N}} + I_{ref} R_{TX} \quad \text{(Eqs. 5 and 6)}$$

$$R_{TX} = \frac{\partial V_{GS}}{\partial I_D} = \frac{1}{\mu_N C_{ox}\left(\frac{W}{L}\right)(V_{GS} - V_T)}$$

With increasing temperature, the decreasing VREF from the left side circuit biases the NMOS 310 gate, thus increasing the resistance of NMOS 310, $R_{TX}$. The advantage of this scheme includes simple implementation for robustness by adding a similar circuit to the voltage reference design. The size of NMOS 310 can be designed to have a desired resistance $R_{TX}$.

In one integrated circuit embodiment, the current Iref was set to 5 µA, the NMOS transistor size proportion ratio was 1:N=1:4 (N is a number greater than 1) between NMOS transistors 106 and 108 and/or 306 and 308, the resistance Rs was 8 kΩ, and the source-drain resistance Rds of NMOS transistor 310 was 8 kΩ. In other embodiments, the current Iref can range from 2-10 µA, N=4-16, Rs=1-40 kΩ, and Rds=1-40 kΩ. However, the circuit can be designed with different values without departing from the spirit and scope of the invention.

Figure 3B:
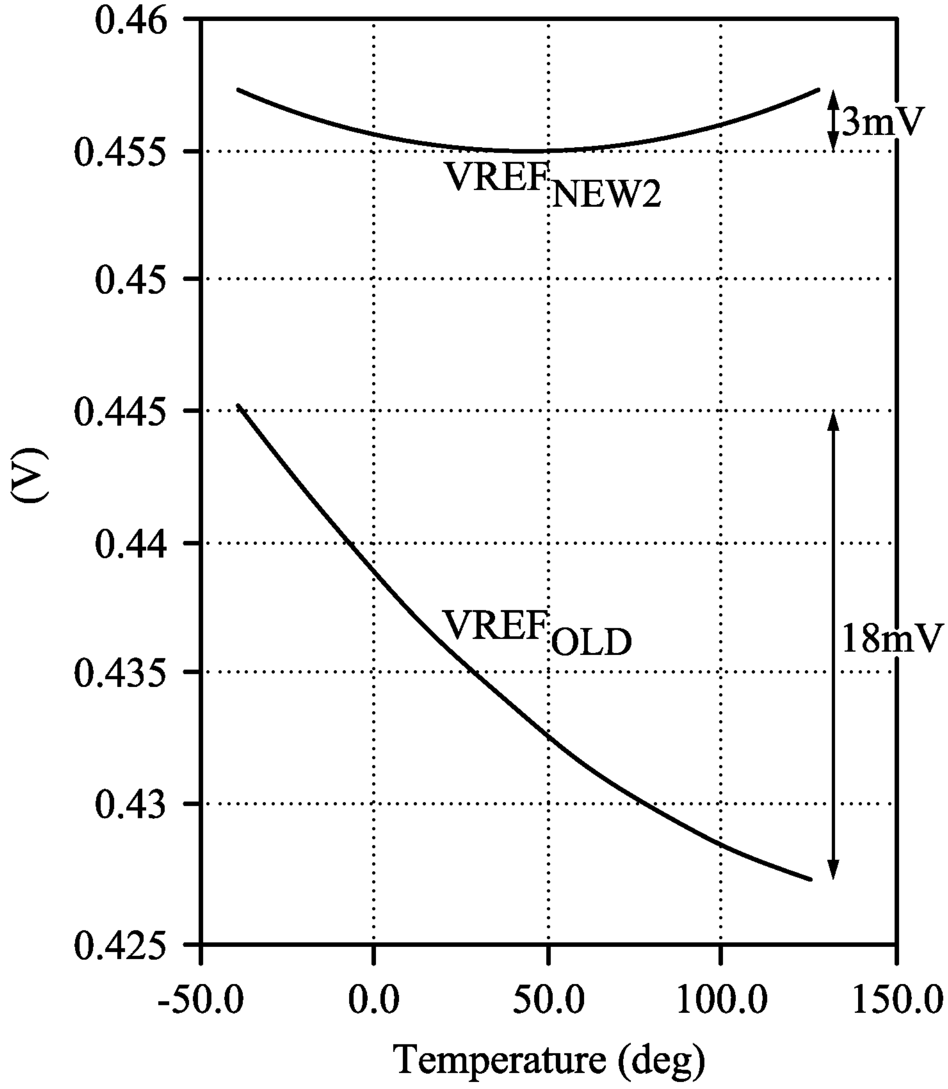
FIG. 3B is a temperature vs. voltage output plot for an embodiment of the voltage reference circuit shown in FIG. 3A.

FIG. 3B is a temperature vs. voltage output plot for an embodiment of the voltage reference circuit shown in FIG. 3A. The temperature variation of $VREF_{OLD}$ over −40° C.-125° C. was 18 mV, but the temperature compensated $VREF_{NEW2}$ varied only 3 mV.

Therefore, a constant Gm voltage reference that requires very small size and power compared to a bandgap design can be achieved with much improved accuracy of the output voltage by adding a temperature compensation feedback element that can control the voltage variation. A skilled person in the art will appreciate that there can be many variations of these embodiments.

One aspect of this description relates to a voltage reference circuit with temperature compensation comprising a power supply, a first reference voltage supply, a first PMOS transistor with a source connected to the power supply, a second PMOS transistor with a source connected to the power supply and a gate and a drain connected together to the gate of the first PMOS. The voltage reference circuit also comprises a first NMOS transistor with a gate and a drain connected together to the drain of the first PMOS transistor. The voltage reference circuit further comprises a second NMOS transistor with a drain connected to the drain of the second PMOS transistor and a gate connected together with the gate of the first NMOS transistor to the first reference voltage supply. The voltage reference circuit additionally comprises a resistor connected to the source of the second NMOS transistor and ground.

The voltage reference circuit also comprises a second reference voltage supply; a third PMOS transistor with a source connected to the power supply. The voltage reference circuit further comprises a fourth PMOS transistor with a source connected to the power supply and a gate and a drain connected together to the gate of the third PMOS. The voltage reference circuit additionally comprises a third NMOS transistor with a gate and a drain connected together to the drain of the third PMOS transistor.

The voltage reference circuit also comprises a fourth NMOS transistor with a drain connected to the drain of the fourth PMOS transistor and a gate connected together with the gate of the third NMOS transistor to the second reference voltage output. The voltage reference circuit additionally comprises a fifth NMOS transistor with a drain connected to the source of the fourth NMOS transistor, a source connected to the ground, a gate connected to the first reference voltage output.

Another aspect of this description relates to a voltage reference circuit with temperature compensation comprising a power supply, a first reference voltage supply, a first PMOS transistor with a source connected to the power supply, a second PMOS transistor with a source connected to the power supply and a gate and a drain connected together to the gate of the first PMOS. The voltage reference circuit also comprises a first NMOS transistor with a gate and a drain connected together to the drain of the first PMOS transistor. The voltage reference circuit further comprises a second NMOS transistor with a drain connected to the drain of the second PMOS transistor and a gate connected together with the gate of the first NMOS transistor to the first reference voltage supply. The voltage reference circuit additionally comprises a resistor connected to the source of the second NMOS transistor and ground.

The voltage reference circuit also comprises a second reference voltage supply; a third PMOS transistor with a source connected to the power supply. The voltage reference circuit further comprises a fourth PMOS transistor with a source connected to the power supply and a gate and a drain connected together to the gate of the third PMOS. The voltage reference circuit additionally comprises a third NMOS transistor with a gate and a drain connected together to the drain of the third PMOS transistor.

The voltage reference circuit also comprises a fourth NMOS transistor with a drain connected to the drain of the fourth PMOS transistor and a gate connected together with the gate of the third NMOS transistor to the second reference voltage output. The voltage reference circuit additionally comprises a fifth NMOS transistor with a drain connected to the source of the fourth NMOS transistor, a source connected to the ground, a gate connected to the first reference voltage output. The reference voltage supply is expressed by:

$$VREF_{NEW2} = V_{TH2} + \sqrt{\frac{2I_{out}}{\mu_N C_{ox} K\left(\frac{W}{L}\right)_N}} + I_{ref} R_{TX}.$$

Although the present embodiments and its advantages have been described in detail, it should be understood that various changes, substitutions and alterations can be made herein without departing from the spirit and scope of the appended claims. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A voltage reference circuit with temperature compensation, comprising:
- a power supply;
- a first reference voltage output;
- a first PMOS transistor with a source connected to the power supply;
- a second PMOS transistor with a source connected to the power supply and a gate and a drain connected together to a gate of the first PMOS transistor;
- a first NMOS transistor with a gate and a drain connected together to a drain of the first PMOS transistor;
- a second NMOS transistor with a drain connected to the drain of the second PMOS transistor and a gate connected together with the gate of the first NMOS transistor to the first reference voltage output;
- a resistor connected to a source of the second NMOS transistor and a ground;
- a second reference voltage output;
- a third PMOS transistor with a source connected to the power supply;
- a fourth PMOS transistor with a source connected to the power supply and a gate and a drain connected together to a gate of the third PMOS transistor;
- a third NMOS transistor with a gate and a drain connected together to a drain of the third PMOS transistor;
- a fourth NMOS transistor with a drain connected to the drain of the fourth PMOS transistor and a gate connected together with the gate of the third NMOS transistor to the second reference voltage output; and
- a fifth NMOS transistor with a drain connected to a source of the fourth NMOS transistor, a source connected to the ground, a gate connected to the first reference voltage output;
- wherein a resistance of the fifth NMOS transistor is expressed by:

$$R_{TX} = \frac{\partial V_{GS}}{\partial I_D} = \frac{1}{\mu_N C_{ox}\left(\frac{W}{L}\right)(V_{GS} - V_T)}.$$

2. The voltage reference circuit of claim 1, wherein the fifth NMOS transistor is in a saturation mode.

3. The voltage reference circuit of claim 1, wherein the first NMOS transistor and the second NMOS transistor have a size proportion ratio of 1:K, wherein the size proportion is defined as a width over a length of a channel of a transistor and K is a number greater than 1.

4. The voltage reference circuit of claim 3, wherein K ranges from 4-16.

5. The voltage reference circuit of claim 1, wherein the third NMOS transistor and the fourth NMOS transistor have a size proportion ratio of 1:N, wherein the size proportion is defined as a width over a length of a channel of a transistor and N is a number greater than 1.

6. The voltage reference circuit of claim 5, wherein N ranges from 4-16.

7. The voltage reference circuit of claim 1, wherein the resistor has a resistance ranging from 1-40 kΩ.

8. The voltage reference circuit of claim 1, wherein the fifth NMOS transistor has a source-drain resistance ranging from 1-40 kΩ.

9. The voltage reference circuit of claim 1, wherein the reference current ranges from 2 microAmps (μA) to 10 μA.

10. A voltage reference circuit with temperature compensation, comprising:

a power supply;

a first reference voltage output;

a first PMOS transistor with a source connected to the power supply;

a second PMOS transistor with a source connected to the power supply and a gate and a drain connected together to a gate of the first PMOS transistor;

a first NMOS transistor with a gate and a drain connected together to a drain of the first PMOS transistor;

a second NMOS transistor with a drain connected to the drain of the second PMOS transistor and a gate connected together with the gate of the first NMOS transistor to the first reference voltage output;

a resistor connected to a source of the second NMOS transistor and a ground;

a second reference voltage output;

a third PMOS transistor with a source connected to the power supply;

a fourth PMOS transistor with a source connected to the power supply and a gate and a drain connected together to a gate of the third PMOS transistor;

a third NMOS transistor with a gate and a drain connected together to a drain of the third PMOS transistor;

a fourth NMOS transistor with a drain connected to the drain of the fourth PMOS transistor and a gate connected together with the gate of the third NMOS transistor to the second reference voltage output; and a fifth NMOS transistor with a drain connected to a source of the fourth NMOS transistor, a source connected to the ground, a gate connected to the first reference voltage output, wherein the reference voltage output is expressed by:

$$VREF_{NEW2} = V_{TH2} + \sqrt{\frac{2I_{out}}{\mu_N C_{ox} K\left(\frac{W}{L}\right)_N}} + I_{ref} R_{TX}.$$

11. The voltage reference circuit of claim 10, wherein a resistance of the fifth NMOS transistor is expressed by:

$$R_{TX} = \frac{\partial V_{GS}}{\partial I_D} = \frac{1}{\mu_N C_{ox}\left(\frac{W}{L}\right)(V_{GS} - V_T)}.$$

12. The voltage reference circuit of claim 10, wherein the reference current ranges from 2 microAmps (μA) to 10 μA.

13. The voltage reference circuit of claim 10, wherein the fifth NMOS transistor is in a saturation mode.

14. The voltage reference circuit of claim 10, wherein the first NMOS transistor and the second NMOS transistor have a size proportion ratio of 1:K, wherein the size proportion is defined as a width over a length of a channel of a transistor and K is a number greater than 1.

15. The voltage reference circuit of claim 14, wherein K ranges from 4-16.

16. The voltage reference circuit of claim 10, wherein the third NMOS transistor and the fourth NMOS transistor have a size proportion ratio of 1:N, wherein the size proportion is defined as a width over a length of a channel of a transistor and N is a number greater than 1.

17. The voltage reference circuit of claim 16, wherein N ranges from 4-16.

18. The voltage reference circuit of claim 10, wherein the resistor has a resistance ranging from 1-40 kΩ.

19. The voltage reference circuit of claim 10, wherein the fifth NMOS transistor has a source-drain resistance ranging from 1-40 kΩ.

* * * * *